(12) United States Patent
Liang

(10) Patent No.: US 11,930,619 B2
(45) Date of Patent: Mar. 12, 2024

(54) PLUG-IN PUMP INSTALLATION STRUCTURE OF COOLING DISTRIBUTION UNIT

(71) Applicant: ABLECOM TECHNOLOGY INC., Taoyuan (TW)

(72) Inventor: Chien-Fa Liang, Taoyuan (TW)

(73) Assignee: ABLECOM TECHNOLOGY INC., Taoyuan (TW)

( * ) Notice: Subject to any disclaimer, the term of this patent is extended or adjusted under 35 U.S.C. 154(b) by 106 days.

(21) Appl. No.: 17/885,700

(22) Filed: Aug. 11, 2022

(65) Prior Publication Data
US 2024/0057285 A1 Feb. 15, 2024

(51) Int. Cl.
*H05K 7/20* (2006.01)

(52) U.S. Cl.
CPC ..... *H05K 7/20272* (2013.01); *H05K 7/20645* (2013.01)

(58) Field of Classification Search
CPC .............. H05K 7/20272; H05K 2/20645
See application file for complete search history.

(56) References Cited

U.S. PATENT DOCUMENTS

| | | | |
|---|---|---|---|
| 7,929,305 B1 * | 4/2011 | Pal ..................... | H05K 7/20645 174/15.1 |
| 2012/0281359 A1 * | 11/2012 | Arney ................ | H05K 7/20645 29/428 |
| 2018/0279510 A1 * | 9/2018 | Johnson ............. | H05K 7/20772 |
| 2021/0285534 A1 | 9/2021 | Wiessmann et al. | |
| 2023/0387499 A1 * | 11/2023 | Lu ...................... | H05K 7/20645 |

FOREIGN PATENT DOCUMENTS

TW 202210716 A 3/2022

OTHER PUBLICATIONS

Office Action dated Feb. 24, 2023 of the corresponding Taiwan patent application No. 111121708.

* cited by examiner

*Primary Examiner* — Kevin R Barss
(74) *Attorney, Agent, or Firm* — Chun-Ming Shih; HDLS IPR SERVICES

(57) ABSTRACT

A plug-in pump installation structure of a cooling distribution unit is disclosed. A pump seat is disposed in a machine case and has a fixed joint. A plug-in pump has a pump main body and a moveable joint. The plug-in pump is plugged or removed relative to the pump seat through the moveable joint and the fixed joint being connected or released. One distal end of each rotary arm of a handgrip has a latching hook. The rotary arms are pivotally connected at opposite sides of the pump main body. When the handgrip is folded on the machine case, the latching hook abuts against a protrusion disposed on a block piece of the machine case, when the handgrip is rotated to be away from the machine case, the latching hooks of the rotary arm is released from the abutted protrusion.

9 Claims, 9 Drawing Sheets

PLUG-IN PUMP INSTALLATION STRUCTURE OF COOLING DISTRIBUTION UNIT

BACKGROUND OF THE DISCLOSURE

Technical Field

The present disclosure relates to a cooling distribution unit, especially to a plug-in pump installation structure of a cooling distribution unit.

Description of Related Art

A related-art sever system structure has a plurality of servers arranged in an array format and disposed in a machine cabinet. Each of the servers is disposed with a calculation module, a power supply module and a hard disk or liquid cooling heat dissipation module according to the functions of the servers. Moreover, there are a plurality of machine cases disposed in a related-art machine cabinet, and the amount may be equal to or more than one. As such, at least one cooling distribution unit is disposed in the server system to perform a heat dissipating process to the plurality of servers in the machine cabinet.

The related-art cooling distribution unit includes components, for example, a pump, a heat dissipation sink, and a fan, to perform the heat dissipating process to the heat generating units in the system. However, the pump disposed in the server system is mostly locked by utilizing a screw, thus a tool is needed to unlock the screw when the pump is in a malfunction status or required to be maintained, and the assembly operation is inconvenient. As such a requirement of adjusting the amounts of the pumps or processing a replacing operation may not be achieved according to actual operating needs, thus the practicability in operation is lowered.

Accordingly, the applicant of the present disclosure has devoted himself for overcoming the mentioned disadvantages.

SUMMARY OF THE DISCLOSURE

The present disclosure is to provide a plug-in pump installation structure of a cooling distribution unit, in which a plug-in pump is connected into a machine case in a plugging/unplugging way to simplify the detaching or assembling operation.

The present disclosure is to provide a plug-in pump installation structure of a cooling distribution unit, in which a plug-in pump is pivotally connected to a handgrip, the handgrip may be outwardly rotated from one side of the machine case to make an external force be applied to the handgrip, thus the plug-in pump is driven to outwardly move to be released from a plugged status.

Accordingly, the present disclosure provides a plug-in pump installation structure of a cooling distribution unit, the plug-in pump installation structure includes a machine case, a pump seat, a plug-in pump, and a handgrip. The machine case has a slide slot and a plurality of block pieces disposed at opposite sides of the slide slot, and the plurality of block pieces have a plurality of protrusions. The pump seat is disposed in the machine case and has a fixed joint. The plug-in pump has a pump main body and a moveable joint disposed on the pump main body. The plug-in pump is plugged or removed relative to the pump seat through the moveable joint and the fixed joint being connected or released. The handgrip has a handgrip main body and a pair of rotary arms connected to the handgrip main body. One distal end of each of the rotary arm is disposed with a latching hook. The pair of rotary arms are pivotally connected to opposite sides of the pump main body. When the handgrip is folded at one side of the machine case, the latching hook of the rotary arm abuts against the corresponding protrusion, when the handgrip is rotated to be away from the machine case, the latching hooks of the rotary arm is released from the abutted protrusion.

Advantages achieved by the present disclosure are as follows. According to the plug-in pump installation structure of the cooling distribution unit, the pump seat disposed in the machine case has a fixed connector, and the plug-in pump has a moveable connector. As such, the plug-in pump is plugged or released relative to the pump seat through the moveable connector and the fixed connector being connected or disconnected. The plug-in pump has the handgrip. The handgrip has the pair of rotary arms having one distal end thereof being disposed with a latching hook. The rotary arms are pivotally connected to opposite sides of the pump main body, thus the handgrip of the plug-in pump is folded at one side of the machine case or rotated to be away from the machine case through the latching hooks of the rotary arms abutting against or releasing from the protrusions, and the plug-in pump is driven to outwardly move to be released from the plugged status when an external force is applied to the handgrip to make operating procedures, for example maintenances or replacements, be easily processed. Accordingly, the practicability of the present disclosure is increased.

BRIEF DESCRIPTION OF THE DRAWINGS

The features of the disclosure believed to be novel are set forth with particularity in the appended claims. The disclosure itself, however, may be best understood by reference to the following detailed description of the disclosure, which describes a number of exemplary embodiments of the disclosure, taken in conjunction with the accompanying drawings, in which:

DETAILED DESCRIPTION OF THE DISCLOSURE

The technical contents of this disclosure will become apparent with the detailed description of embodiments accompanied with the illustration of related drawings as follows. It is intended that the embodiments and drawings disclosed herein are to be considered illustrative rather than restrictive.

Figure 1:
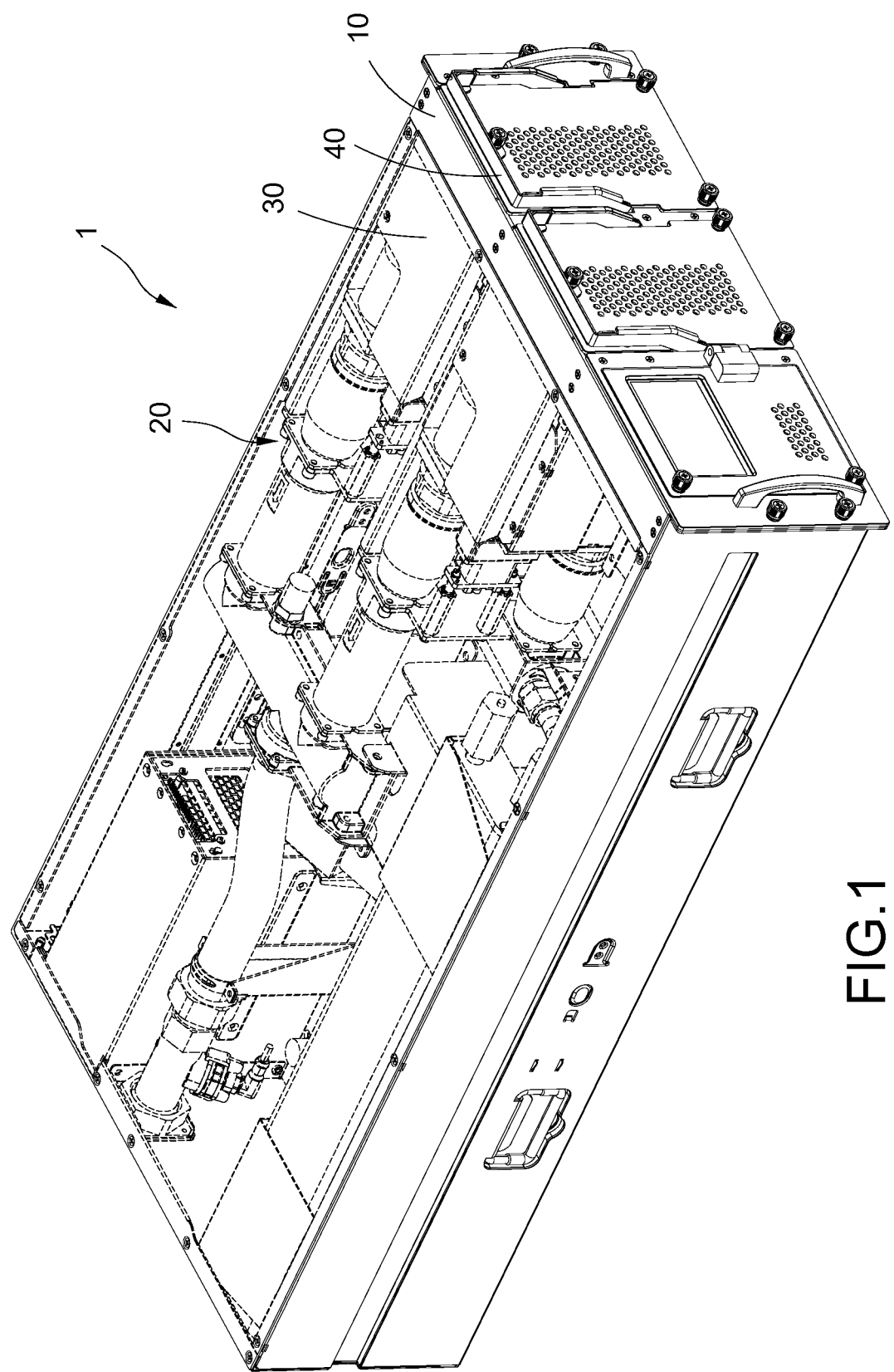
FIG. 1 is a perspective view showing the assembly of the cooling distribution unit according to the present disclosure.
Figure 2:
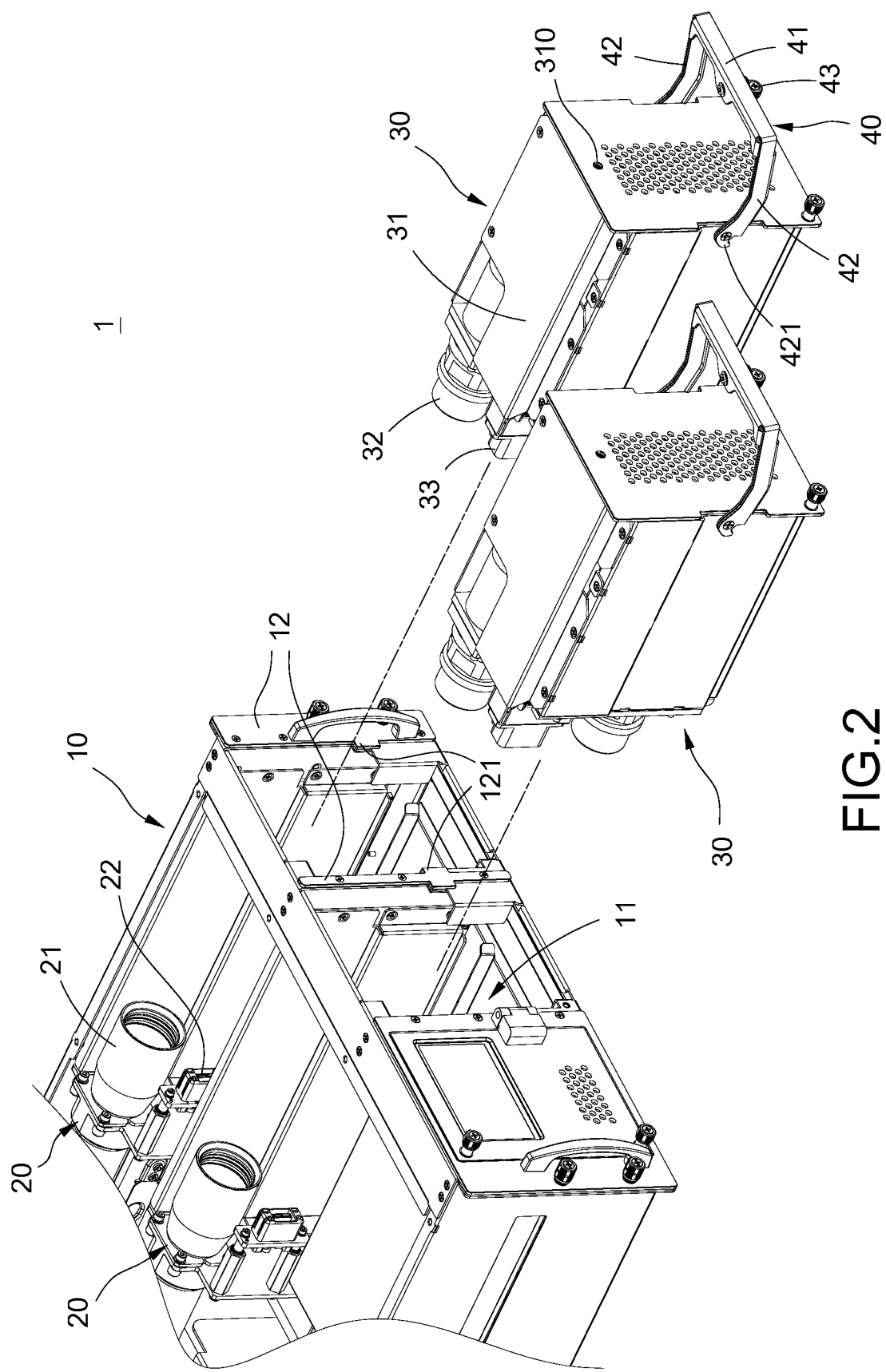
FIG. 2 is a schematic view showing a plugging status of the plug-in pump according to the present disclosure.

Please refer to FIG. 1 and FIG. 2, FIG. 1 is a perspective view showing the assembly of the cooling distribution unit according to the present disclosure, and FIG. 2 is a schematic view showing a plugging status of the plug-in pump according to the present disclosure. The present disclosure provides a plug-in pump installation structure 1 of a cooling distribution unit, the plug-in pump installation structure 1 includes a machine case 10, a pump seat 20, a plug-in pump 30 and a handgrip 40. The pump seat 20 is disposed in the machine case 10. The plug-in pump 30 is combined with the pump seat 20 in a plugging/unplugging way. The handgrip 40 is pivotally connected with the plug-in pump 30, thus the handgrip 40 rotates relative to the plug-in pump 30.

As shown in FIG. 2, the machine case 10 has a slide slot 11 and a plurality of block pieces 12 disposed at opposite sides of the slide slot 11 (two sides of the slide slot 11 opposite to each other). A plurality of protrusions 121 are disposed on the plurality of block pieces 12. The pump seat 20 is disposed in the machine case 10. The pump seat 20 has a fixed joint 21.

The plug-in pump 30 has a pump main body 31 and a moveable joint 32 disposed on the pump main body 31. The plug-in pump 30 is plugged or removed relative to the pump seat 20 through connection or disconnection between the moveable joint 32 and the fixed joint 21.

In some embodiments, the pump seat 20 has a fixed connector 22 disposed at one side of the fixed joint 21. The plug-in pump 30 has a moveable connector 33 disposed at one side of the moveable joint 32. As such, the plug-in pump 30 is hot plugged relative to the pump seat 20 through connection or disconnection between the moveable connector 33 and the fixed connector 22.

The handgrip 40 has a handgrip main body 41 and a pair of rotary arms 42 correspondingly connected to two sides of the handgrip main body 41. One distal end of each of the rotary arms 42 is disposed with a latching hook 421. The pair of rotary arms 42 are pivotally connected to opposite sides of the pump main body 31 (two sides of the pump main body 31 opposite to each other).

In some embodiments, the handgrip 40 further has a screw 43. The pump main body 31 has a lock hole 310. The handgrip 40 is locked on the pump main body 31 through locking the screw 43 in the lock hole 310. In some embodiments, the screw 43 is an anti-dropping screw disposed on the handgrip main body 41. As such, the screw 43 is prevented from being dropped or lost when the screw 43 is released from the lock hole 310.

Figure 3:
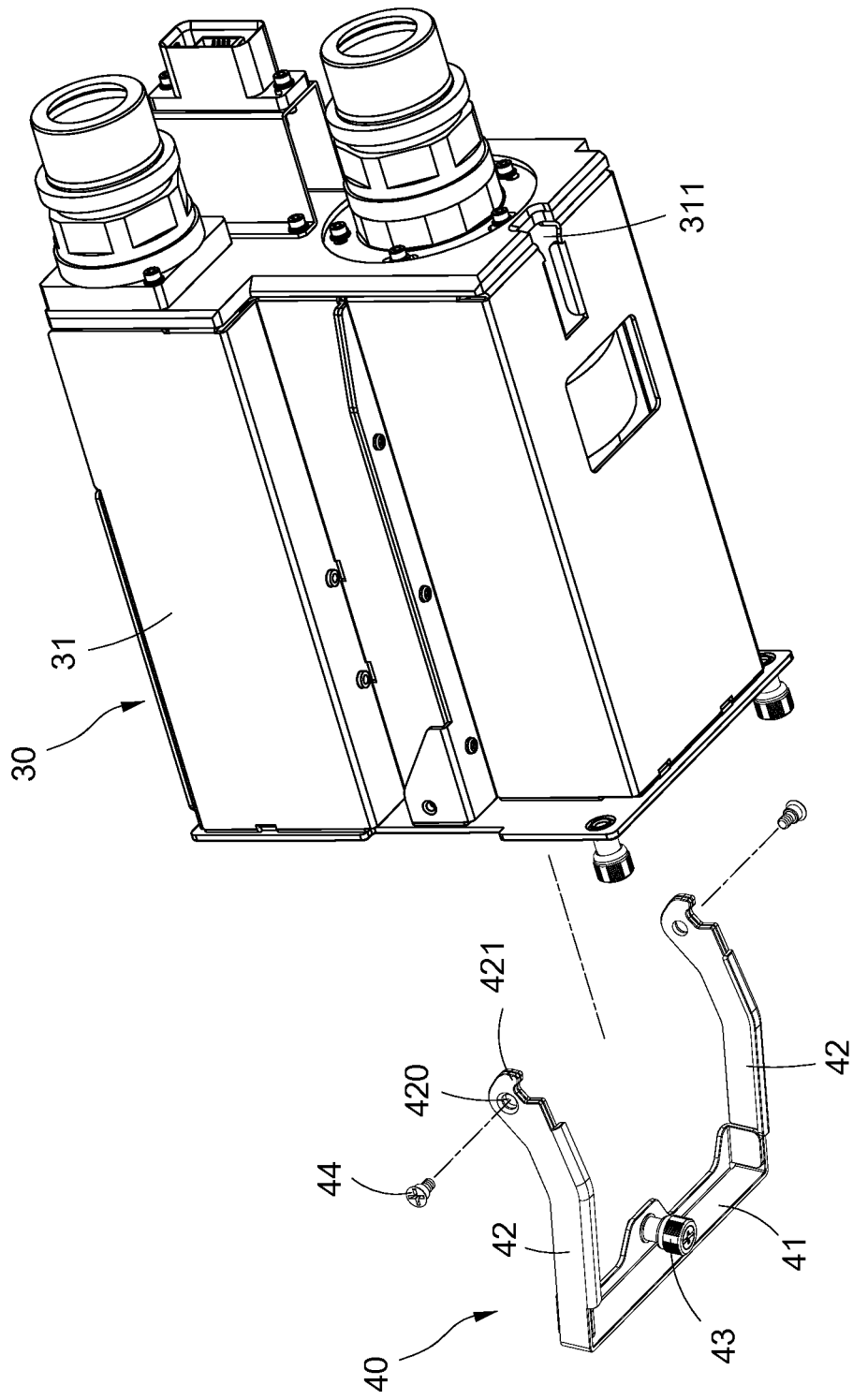
FIG. 3 is a perspective view showing the assembly of the plug-in pump according to the present disclosure.
Figure 4:
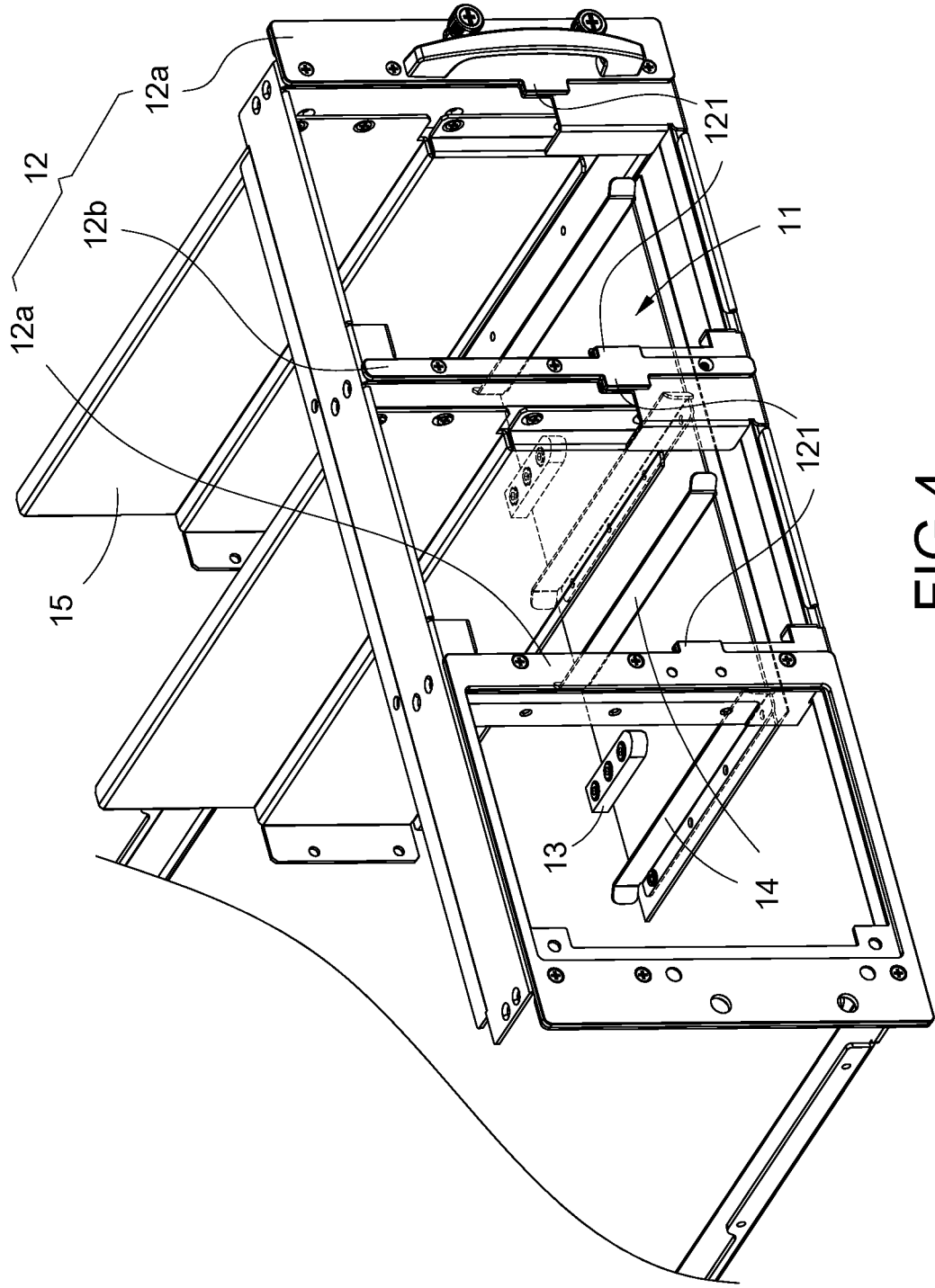
FIG. 4 is a partially perspective view showing the machine case according to the present disclosure.
Figure 5:
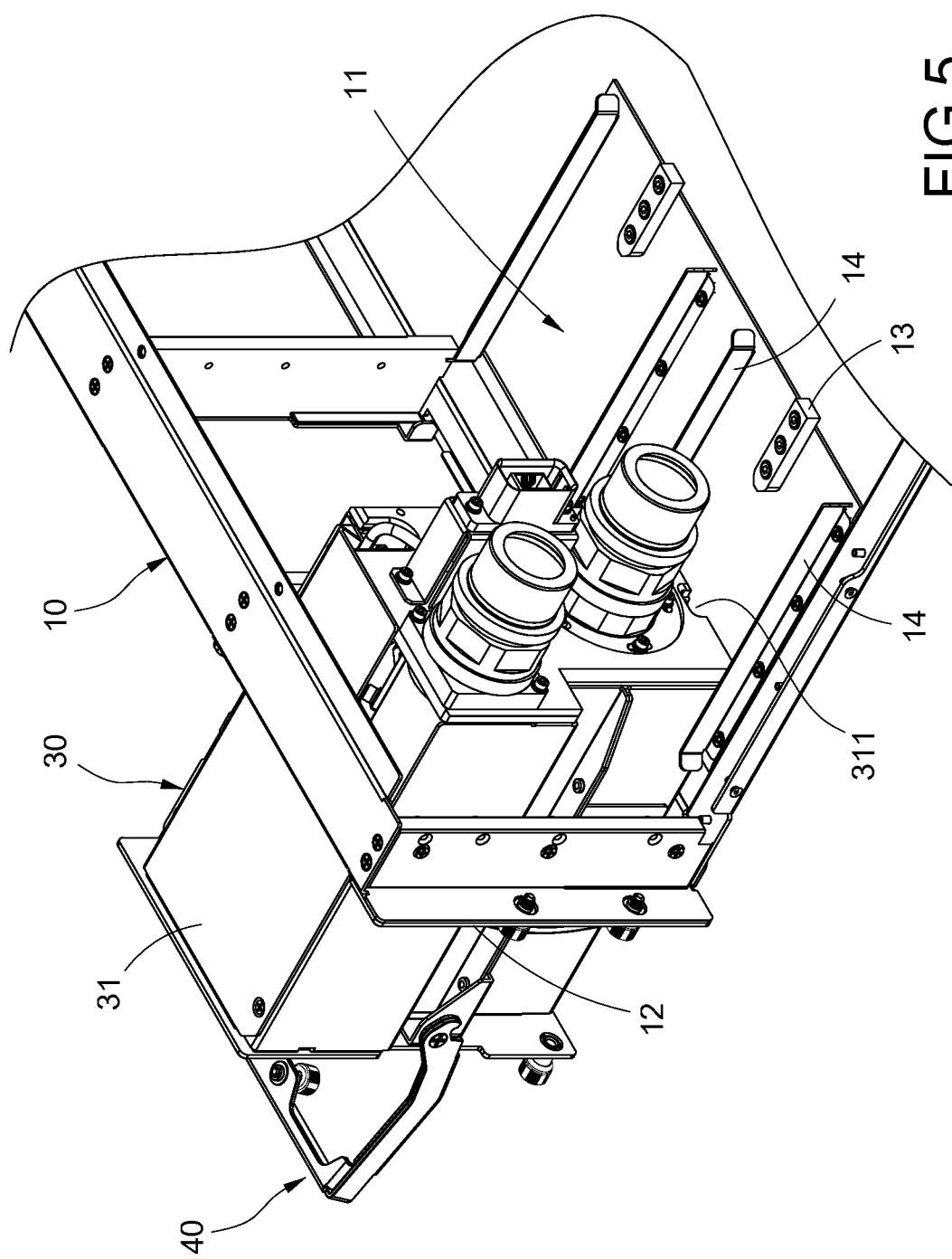
FIG. 5 is a schematic view showing the plug-in pump being inserted in the machine case according to the present disclosure.

Please refer to FIG. 3, FIG. 4 and FIG. 5, FIG. 3 is a perspective view showing the assembly of the plug-in pump according to the present disclosure, FIG. 4 is a partially transparent view showing the machine case according to the present disclosure, and FIG. 5 is a schematic view showing the plug-in pump being inserted in the machine case according to the present disclosure. In some embodiments, the handgrip main body 41 and the pair of rotary arms 42 of the handgrip 40 are disposed in a U-like status, as shown in FIG. 3. The handgrip 40 further has a plurality of pivotal members 44. One distal end of each of the rotary arms 42 is disposed with a pivotal hole 420 at a location close to the latching hook 421. The pair of rotary arms 42 pivotally rotate relative to the pump main body 31 through the pivotal members 44 passing through the pivotal holes 420.

In some embodiments, the machine case 10 has a plurality of the slide slots 11 and the plurality of block pieces 12, as shown in FIG. 4. The plurality of block pieces 12 have two outer block pieces 12a disposed at two lateral sides of the machine case 10 and at least one inner block piece 12b disposed between the two outer block pieces 12a. The plurality of block pieces 12 have the plurality of protrusions 121. Details are provided as follows. Each of the outer block pieces 12a is disposed with one of the protrusions 121 arranged towards an inner side of the machine case 10. Opposite sides of the inner block piece 12b are respectively disposed with one of the protrusions 121. As such, the protrusions 121 of the outer block pieces 12a of the machine case 10 abut against the rotary arms 42 at the outer side of the plug-in pump 30. The two protrusions 121 of the inner block piece 12b abut against the two rotary arms 42 at two adjacent inner sides of the plug-in pump 30.

In some embodiments, the machine case 10 has a guiding block 13 and a pair of guiding rails 14, as shown in FIG. 4 and FIG. 5. The pump main body 31 is disposed with a guiding slot 311 corresponding to the guiding block 13, and the pump main body 31 enters the slide slot 11 along the pair of guiding rails 14.

In some embodiments, a guiding plate 15 is disposed at one side of the machine case 10. One side of the pump main body 31 slides to enter the slide slot 11 along the guiding plate 15.

Figure 6:
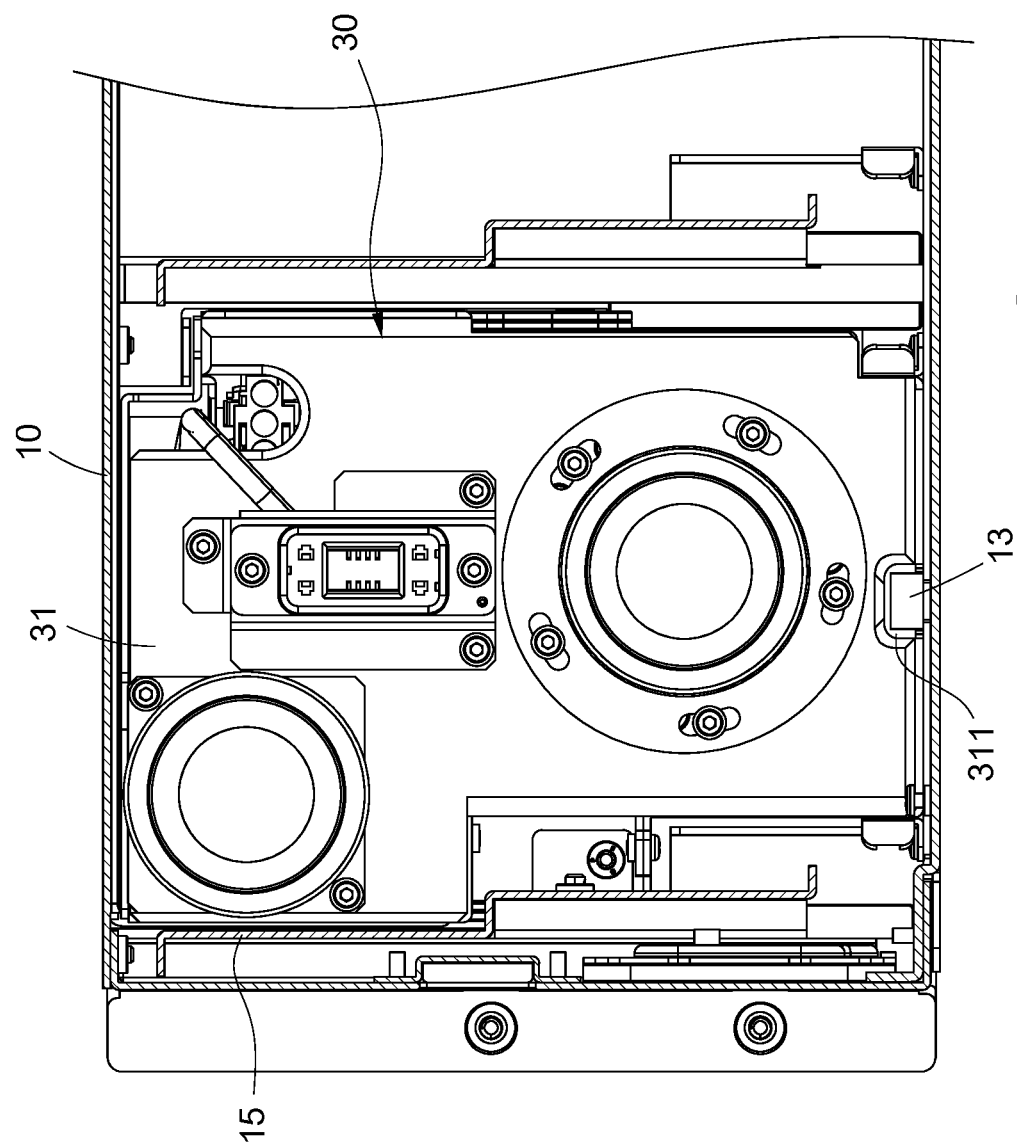
FIG. 6 and FIG. 7 are cross sectional views showing the assembly of the plug-in pump and the machine case according to the present disclosure.
Figure 7:
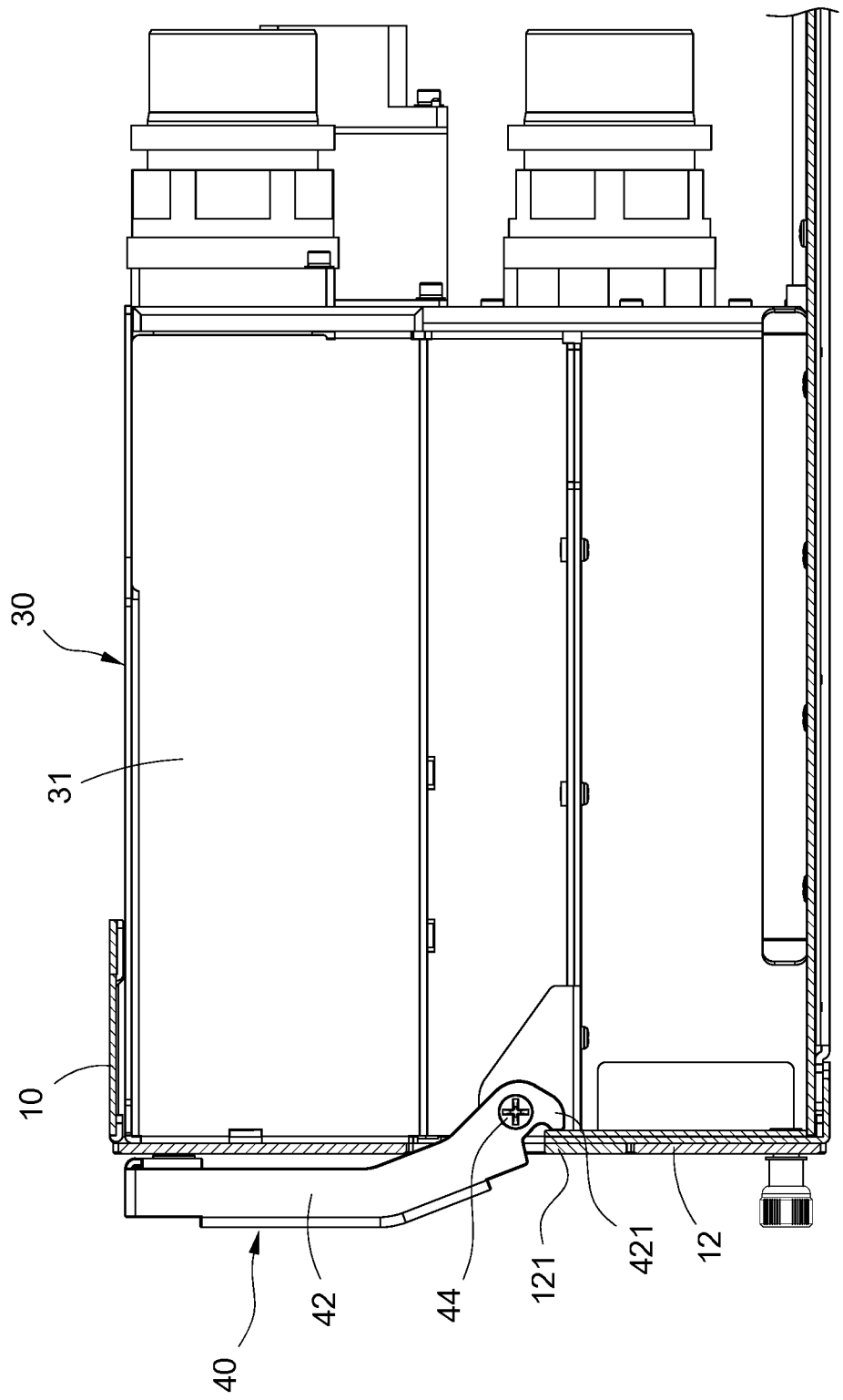

Please refer to FIG. 6 and FIG. 7, which are cross sectional views showing the assembly of the plug-in pump and the machine case according to the present disclosure. As shown in FIG. 6, when the plug-in pump 30 is plugged in the slide slot 11, the guiding slot 311 of the pump main body 31 and the guiding block 13 of the machine case 10 are mutually positioned. One side of the pump main body 31 abuts against the guiding plate 15 of the machine case 10. As shown in FIG. 7, after the plug-in pump 30 is positioned in the slide slot 11, the handgrip 40 is upwardly rotated to make the latching hooks 421 of the pair of rotary arms 42 abut against the protrusions 121 of the block pieces 12, thus the handgrip 40 is folded at one side of the machine case 10.

Figure 8:
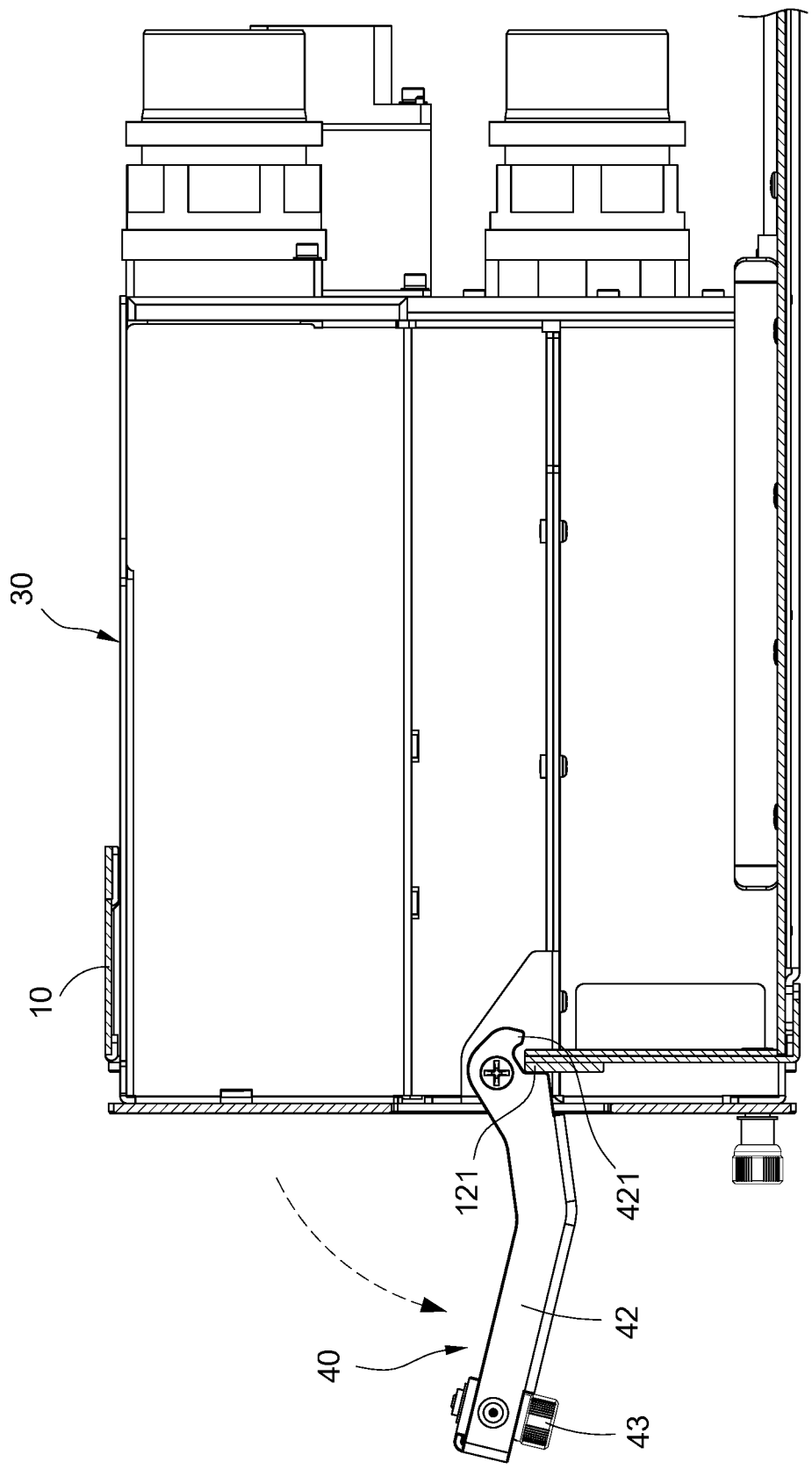
FIG. 8 is a schematic view showing the handgrip of the plug-in pump being outwardly rotated according to the present disclosure.
Figure 9:
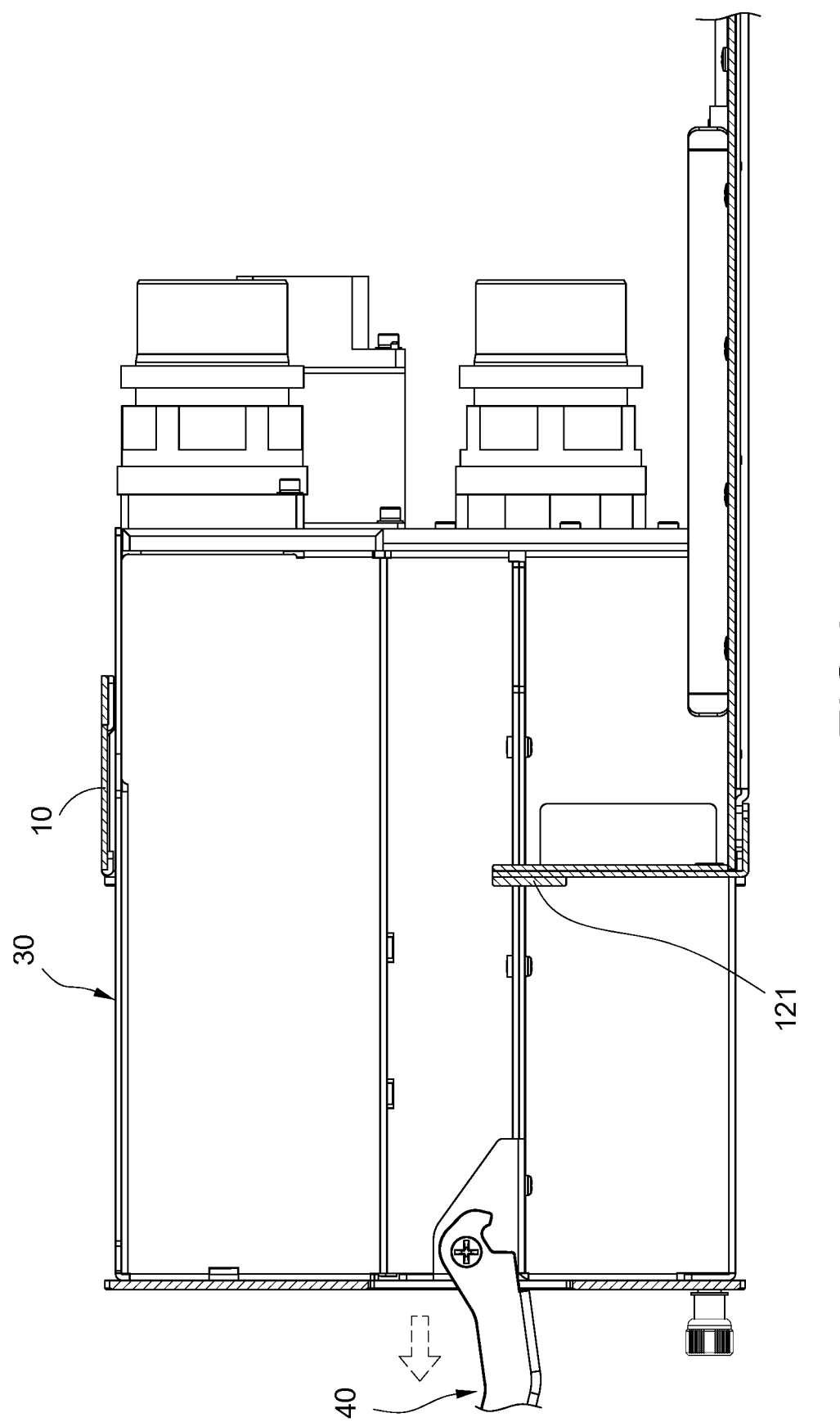
FIG. 9 is a schematic view showing the plug-in pump being removed from the machine case according to the present disclosure.

Please refer to FIG. 8 and FIG. 9, wherein FIG. 8 is a schematic view showing the handgrip of the plug-in pump being outwardly rotated according to the present disclosure; and FIG. 9 is a schematic view showing the plug-in pump being removed from the machine case according to the present disclosure. As shown in FIG. 8, when a user desires to remove the plug-in pump 30 from the machine case 10, the screw 43 is firstly unlocked, and then the handgrip 40 is downwardly rotated. At this moment, the latching hooks 421 of the pair of rotary arms 42 are released from the protrusions 121. As shown in FIG. 9, the plug-in pump 30 is driven to outwardly move to be released from the plugged status when an external force is applied to the handgrip 40. Accordingly, the plug-in pump 30 is removed from the machine case 10, and operating procedures, for example maintenances or replacements, may be easily processed.

While this disclosure has been described by means of specific embodiments, numerous modifications and variations could be made thereto by those skilled in the art without departing from the scope and spirit of this disclosure set forth in the claims.

What is claimed is:

1. A plug-in pump installation structure of a cooling distribution unit, the plug-in pump installation structure comprising:

a machine case, comprising a slide slot and a plurality of block pieces disposed on two sides of the slide slot opposite to each other, wherein the plurality of block pieces comprises a plurality of protrusions;

a pump seat, disposed in the machine case and comprising a fixed joint;

a plug-in pump, comprising a pump main body and a moveable joint disposed on the pump main body, wherein the plug-in pump is plugged or removed relative to the pump seat through the moveable joint and the fixed joint being connected or released; and a handgrip, comprising a handgrip main body and a pair of rotary arms connected to the handgrip main body, wherein each of the rotary arms comprises a latching hook disposed on one distal end thereof, and the pair of rotary arms are pivotally connected to two sides of the pump main body opposite to each other;

wherein, when the handgrip is folded at one side of the machine case, the latching hooks of the rotary arms abut against the protrusions correspondingly, when the handgrip is rotated to be away from the machine case, the latching hooks of the rotary arms are released from the protrusions being abutted.

2. The plug-in pump installation structure according to claim 1, wherein the machine case comprises at least two of the slide slots, a plurality of the pump seats with an amount corresponding to an amount of the slide slots, a plurality of the plug-in pumps with an amount corresponding to the amount of the pump seats, and a plurality of the handgrips disposed corresponding to the plug-in pumps, the block pieces comprise two outer block pieces disposed on two lateral sides of the machine case and at least one inner block piece disposed between the two outer block pieces, one of the protrusions is disposed on each of the outer block pieces toward an inner side of the machine case, another of the protrusion is disposed at two sides of the at least one inner block piece, the protrusion of each of the outer block pieces abuts against the rotary arm located at an outer side of the handgrip of the plug-in pump, and the protrusion of each of the inner block pieces abuts against the rotary arm located at an inner side of the plug-in pump.

3. The plug-in pump installation structure according to claim 1, wherein the pump seat comprises a fixed connector disposed at one side of the fixed joint, the plug-in pump comprises a moveable connector disposed at one side of the moveable joint, and the plug-in pump is hot plugged relative to the pump seat through the moveable connector and the fixed connector being connected or disconnected.

4. The plug-in pump installation structure according to claim 1, wherein the machine case comprises a guiding block and a pair of guiding rails, the pump main body comprises a guiding slot corresponding to the guiding block, and the pump main body is configured to enter the slide slot along the pair of guiding rails to make the guiding slot and the guiding block be mutually positioned.

5. The plug-in pump installation structure according to claim 1, wherein a guiding plate is disposed on one side of the machine case, and one side of the pump main body is configured to slide to enter the slide slot along the guiding plate.

6. The plug-in pump installation structure according to claim 1, wherein the handgrip is in a U shape.

7. The plug-in pump installation structure according to claim 1, wherein the handgrip comprises a plurality of pivotal members, each of the rotary arms comprises a pivotal hole disposed on one distal end thereof and located close to the latching hook, and the pair of rotary arms pivotally rotate relative to the pump main body through the pivotal members passing through the pivotal holes.

8. The plug-in pump installation structure according to claim 1, wherein the handgrip comprises a screw, the pump main body comprises a lock hole, and the handgrip is locked on the pump main body through the screw being locked in the lock hole.

9. The plug-in pump installation structure according to claim 8, wherein the screw is an anti-dropping screw disposed on the handgrip main body.

* * * * *